(12) United States Patent
Tseng et al.

(10) Patent No.: US 10,177,082 B2
(45) Date of Patent: Jan. 8, 2019

(54) METHOD FOR FORMING SEMICONDUCTOR PACKAGE USING CARBON NANO MATERIAL IN MOLDING COMPOUND

(71) Applicant: Taiwan Semiconductor Manufacturing Co., Ltd., Hsin-Chu (TW)

(72) Inventors: Chun-Hao Tseng, Taichung (TW); Ying-Hao Kuo, Hsinchu (TW); Kuo-Chung Yee, Taoyuan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/823,786

(22) Filed: Nov. 28, 2017

(65) Prior Publication Data

US 2018/0090425 A1 Mar. 29, 2018

Related U.S. Application Data

(63) Continuation of application No. 14/132,407, filed on Dec. 18, 2013, now Pat. No. 9,859,199.

(51) Int. Cl.
*H01L 21/48* (2006.01)
*H01L 21/56* (2006.01)
(Continued)

(52) U.S. Cl.
CPC .... *H01L 23/49816* (2013.01); *H01L 21/4871* (2013.01); *H01L 23/373* (2013.01);
(Continued)

(58) Field of Classification Search
CPC ... H01L 23/49; H01L 23/498; H01L 23/4981; H01L 23/49816; H01L 23/37;
(Continued)

(56) References Cited

U.S. PATENT DOCUMENTS

| 7,132,161 | B2 | 11/2006 | Knowles et al. | |
| 7,494,910 | B2 * | 2/2009 | Mouli | H01L 23/367 378/199 |

(Continued)

OTHER PUBLICATIONS

Dresselhaus et al., Science of Fullerenes and Carbon Nanotubes, book, 1996, pp. 1-985, Elsevier Science (USA), San Diego, California.

(Continued)

*Primary Examiner* — Monica D Harrison
(74) *Attorney, Agent, or Firm* — Eschweiler & Potashnik, LLC (57) ABSTRACT

A method of forming a semiconductor package includes growing a layer of carbon nano material on a chip. The chip has a first surface and a second surface and the layer of carbon nano material is grown on the first surface of the chip. The layer of carbon nano material is configured to provide a path through which heat generated from the chip is dissipated. A substrate is attached to the second surface of the chip. A molding compound is formed above the substrate to encapsulate the chip and the layer of carbon nano material.

20 Claims, 5 Drawing Sheets

(51) Int. Cl.
*H01L 23/498* (2006.01)
*H01L 23/373* (2006.01)
*H01L 23/433* (2006.01)
*H01L 23/31* (2006.01)

(52) U.S. Cl.
CPC ........ *H01L 23/4334* (2013.01); *H01L 21/568* (2013.01); *H01L 23/3128* (2013.01); *H01L 2924/00* (2013.01); *H01L 2924/0002* (2013.01)

(58) Field of Classification Search
CPC ..... H01L 23/373; H01L 23/43; H01L 23/433; H01L 23/4334; H01L 23/31; H01L 23/312; H01L 23/3128; H01L 21/48; H01L 21/487; H01L 21/4871; H01L 21/56; H01L 21/568
USPC ........................................................ 257/712
See application file for complete search history.

(56) References Cited

U.S. PATENT DOCUMENTS

| | | | |
|---|---|---|---|
| 8,327,532 B2 | 12/2012 | Xu et al. | |
| 8,604,615 B2 | 12/2013 | Lee et al. | |
| 8,871,171 B2 | 10/2014 | El-Shall et al. | |
| 8,906,813 B2 | 12/2014 | Won et al. | |
| 8,919,428 B2 | 12/2014 | Cola et al. | |
| 8,957,695 B2 * | 2/2015 | Takahashi | H01L 22/32 257/48 |
| 8,958,207 B2 | 2/2015 | Yamaguchi et al. | |
| 9,281,292 B2 | 3/2016 | Hu et al. | |
| 2014/0124921 A1 | 5/2014 | Lee et al. | |
| 2014/0374891 A1 * | 12/2014 | Low | H01L 23/4334 257/675 |

OTHER PUBLICATIONS

Non-Final Office Action dated Mar. 26, 2015 for U.S. Appl. No. 14/132,407.
Non-Final Office Action dated Nov. 20, 2015 for U.S. Appl. No. 14/132,407.
Final Office Action dated Jun. 28, 2016 for U.S. Appl. No. 14/132,407.
Notice of Allowance dated Jul. 27, 2017 for U.S. Appl. No. 14/132,407.

* cited by examiner

METHOD FOR FORMING SEMICONDUCTOR PACKAGE USING CARBON NANO MATERIAL IN MOLDING COMPOUND

REFERENCE TO RELATED APPLICATION

This Application is a Continuation of U.S. application Ser. No. 14/132,407 filed on Dec. 18, 2013, the contents of which are hereby incorporated by reference in their entirety.

BACKGROUND

Poor heat dissipation is a common issue for microelectronics device packages. Semiconductor chips, especially those with high thermal design power (TDP) requirements can result in localized overheating that can be deleterious to product yield, performance and reliability of the resulting microelectronics device packages. A thermal management device, such as a heat sink, is typically placed on the backside of wafers for heat to be transported through a molding compound encapsulating a surface of the wafer to the surrounding environment. However, the molding compound, which is typically a mixture of an epoxy and a silica filler, has a low thermal conductivity that is generally in the range of 0.6 W/m-K to 0.8 W/m-K. This can make the molding compound a barrier to heat dissipation.

BRIEF DESCRIPTION OF DRAWINGS

Embodiments of the present disclosure are best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

In the following description, specific details are set forth to provide a thorough understanding of embodiments of the present disclosure. However, one having ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are intended for illustration.

Figure 1:
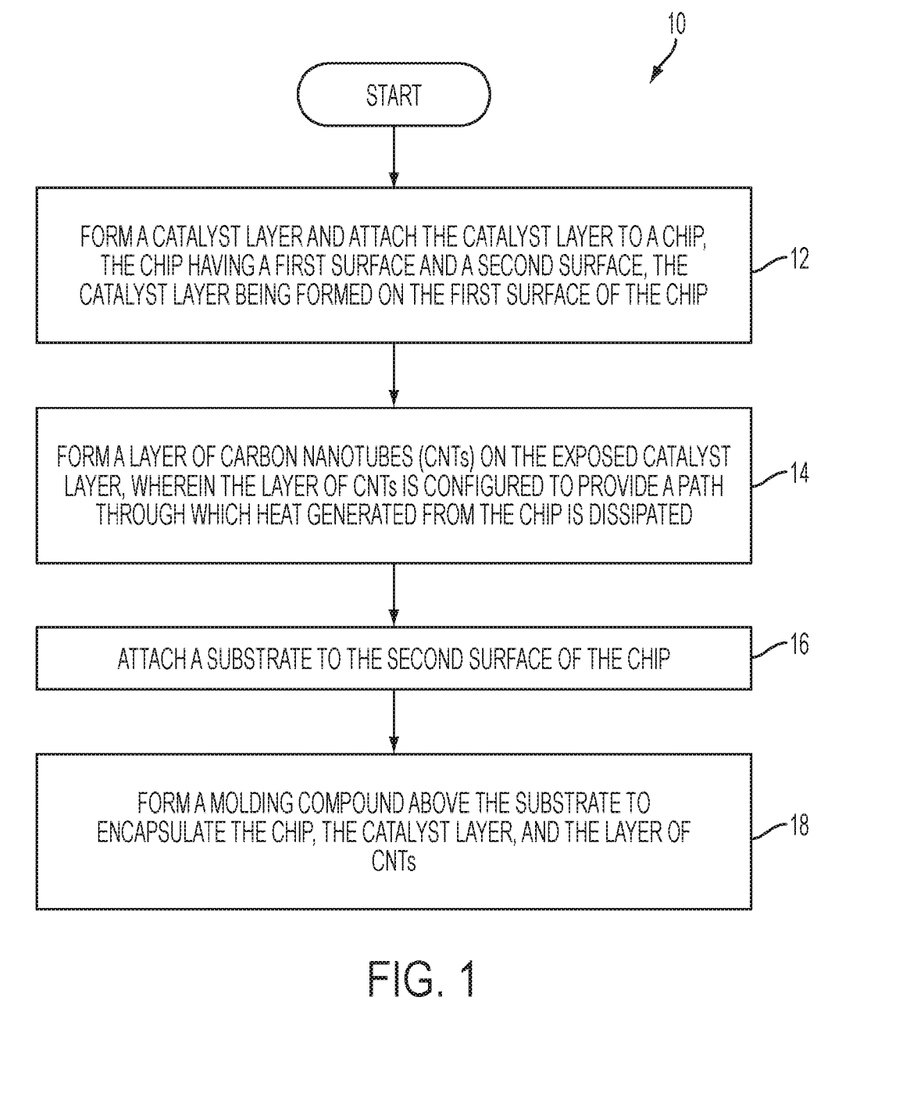
FIG. 1 is a flowchart of a method of fabricating a semiconductor package, according to one or more embodiments of the present disclosure.

FIG. 1 is a flowchart of a method 10 of fabricating a semiconductor package according to various aspects of the present disclosure. Referring to FIG. 1, the method 10 includes block 12, in which a layer of carbon nano material is grown on a chip. The chip has a first surface and a second surface and the layer of carbon nano material is being grown on the first surface of the chip. The layer of carbon nano material is configured to provide a path through which heat generated from the chip is dissipated. The method 10 includes block 14, in which a substrate is attached to the second surface of the chip. The method 10 includes block 16, in which a molding compound is formed above the substrate to encapsulate the chip and the layer of carbon nano material.

In some embodiments, additional processes are performed before, during, and/or after the blocks 12-16 shown in FIG. 1 to complete the fabrication of the semiconductor package, but these additional processes are not discussed herein in detail for the sake of brevity.

FIGS. 2-8 are cross-sectional views of portions of a semiconductor package at various fabrication stages according to one or more embodiments of the present disclosure. FIGS. 2-8 have been simplified for a better illustration of the concepts of the present disclosure. It should be appreciated that the materials, geometries, dimensions, structures, and process parameters described herein are exemplary only, and are not intended to be, and should not be construed to be, limiting to the present disclosure. Many alternatives and modifications will be apparent to those skilled in the art, once informed by the present disclosure.

Figure 2:
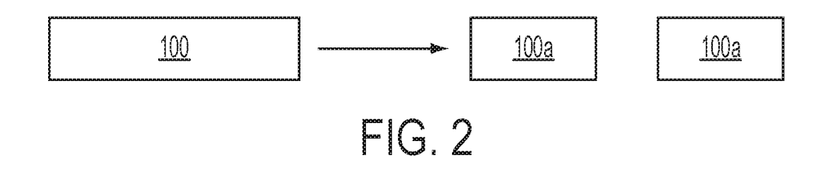
FIGS. 2-8 are cross-sectional views of a semiconductor package at various stages of fabrication, according to one or more embodiments of the present disclosure.

Referring to FIG. 2, a chip 100 is provided and subjected to a singulation process. Chip 100 is a heat sensitive chip such as a memory chip, logic chip, processor chip, or the like and is affixed to a dicing tape or a die frame (not shown) where chip 100 is die cut or diced along cutting lines to separate chip 100 into individual units 100a.

Figure 3:
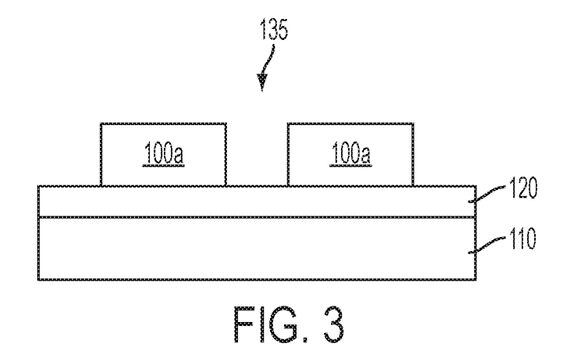

FIG. 3 is a cross-sectional view of a portion of a semiconductor package 135 at a stage of fabrication, according to one or more embodiments of the present disclosure. The semiconductor package 135 includes a first substrate 110. In some embodiments, the first substrate 110 is a wafer carrier. First substrate 110 acts as a temporary support substrate or carrier to facilitate wafer handling, transport, and/or processing. First substrate 110 comprises a combination of a silicon substrate, a glass substrate, a polymer substrate, a polymer-based composite substrate, a thick tape, or other suitable material. First substrate 110, in some embodiments, is a rigid carrier configured to reduce wafer warping and/or to prevent wafer breakage that often occurs during handling and processing. First substrate 110 has chips 100a attached to a surface thereto by an adhesive layer 120. In some embodiments, the adhesive layer 120 comprises one or more of an adhesive bonding, tape bonding, or other suitable material.

Figure 4:
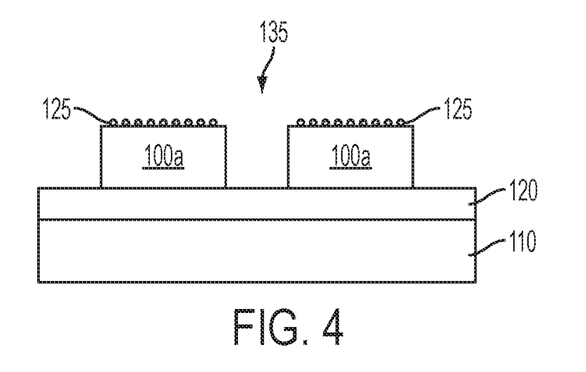

In FIG. 4, a catalyst or seed layer 125 is formed on an upper surface of chips 100a. As the name implies, the catalyst layer 125 acts as a catalyst for the formation of carbon nano materials (e.g., carbon nano fibers (CNFs) or carbon nanotubes (CNTs)) that are grown on chips 100a and the catalyst layer 125 is arranged where this growth is desirable. However, in some embodiments as will be discussed below a catalyst or seed layer is not required for growing carbon nano material.

The catalyst in the catalyst layer 125 is synthesized by approaches such as, for example chemical vapor deposition (CVD), physical vapor deposition (PVD), sputtering, electron beam evaporation, or a colloidal solution process by applying a dispensing process. In some embodiments, the catalyst layer 125 includes iron (Fe), cobalt (Co), nickel (Ni), molybdenum (Mo), gold (Au), silver (Ag), palladium (Pd), platinum (Pt), copper (Cu), aluminum (Al), manganese (Mn), tin (Sn), chromium (Cr), magnesium (Mg), other suitable materials, or combinations thereof. In some embodiments, colloidal metal(s) of one or more types, or oxide particles having one or more particle sizes, are used as the catalyst for growing carbon nano material.

Figure 5:
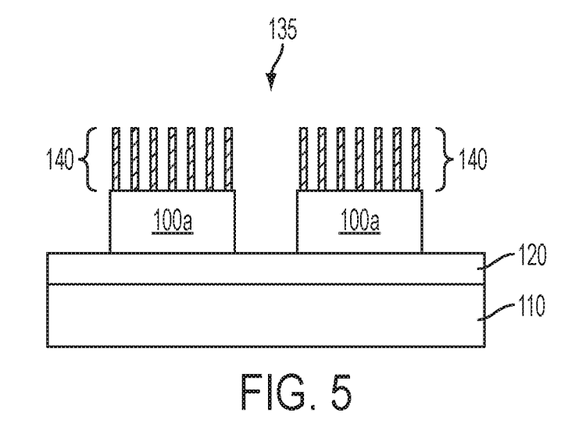

Referring now to FIG. 5, carbon nano material 140 is formed or grown on the exposed catalyst layer 125 (not shown in FIG. 5). The carbon nano material 140 is grown in a generally vertical direction away from the catalyst layer 125. In some embodiments, the carbon nano material 140 is a carbon nano fiber (CNF) material. In some other embodiments, the carbon nano material 140 is a carbon nanotube (CNT) material.

In some embodiments, the carbon nano material 140 is grown by a chemical vapor deposition (CVD) process, an arc discharge process, a laser ablation process, or other suitable processes. Where the carbon nano material 140 is grown by a CVD method, in one or more embodiments, precursors for the CVD comprise carbon atoms. In some embodiments, the carbon nano material 140 further comprises hydrogen atoms. In some embodiments, the precursors comprise ethane, acetylene, argon, oxygen or combinations thereof, or other carbon-containing gases. In another embodiment, the precursors comprise hydrogen gas. In some embodiments, power for the CVD is between 300 and 1,500 W, the deposition temperature of the carbon nano material 140 is between about 300 degrees Celsius and about 450 degrees Celsius, and the deposition pressure for the carbon nano material 140 is about 0.1 Torr and about 10 Torr.

In some embodiments, the carbon nano material 140 is grown by a microwave plasma-enhanced CVD method. In this method, a precursor gas such as methane (in an amount about 10 sccm to about 100 sccm) is introduced with another gas such as argon (about 2 sccm to about 50 sccm) and subsequently plasma is ignited to grow carbon nano material 140. The growth time for forming the carbon nano material 140 varies but in some embodiments the growth time is in the range of about 1 minute to about 60 minutes. The working pressure is maintained at about 0.1 Torr to about 1.0 Torr with growth temperatures between about 300 degrees Celsius to about 600 degrees Celsius and plasma power varied in the range of about 15 W to about 440 W.

In some embodiments, a catalyst or seed layer is not required for growing carbon nano material 140 on chips 100a. In one or more embodiments, carbon nano material 140 is grown directly on a surface of chips 100a by a plasma-enhanced chemical vapor deposition (PECVD) process such as DC PECVD or a microwave PECVD process and using a precursor gas comprising CO, Ar, or O2 at a temperature of about 180 degrees Celsius.

For additional information regarding carbon nano material growth approaches such as growing carbon nanofibers and carbon nanotubes that can be implemented in connection with the exemplary embodiments of the present disclosure, reference may be made to M. S. Dresselhaus, G. Dresselhaus, and P. C. Eklund, "Science of Fullerenes and Carbon Nanotubes" (Academic Press, San Diego, 1996), which is fully incorporated herein by reference.

The carbon nano material 140 grown on chips 100a provide a path through which heat generated by chips 100a is dissipated to the surrounding environment. In addition to thermal management, the carbon nano material 140, in some embodiments, are also configured to provide mechanical support during a molding process to minimize shrinkage and/or warping of a molding compound supplied during the molding process. In one or more embodiments, the carbon nano material 140 are capable of being used in integrated circuit packaging type or technology, including, but not limited to, wired bonded packages, flip chip molded matrix array packages (FCMMAP), and other packages that couple an integrated circuit die to second level interconnects such as a ball grid array, a land grid array, and/or a pin grid array.

In accordance with various embodiments of the present disclosure, the carbon nano material 140 has a thermal conductivity that is high enough to provide sufficient passive cooling for the integrated circuit package. For instance, in some embodiments of the present disclosure, the carbon nano material 140 has a thermal conductivity between about 3 W/m-K and about 10 W/m-K. In some embodiments, depending on the specific materials used in the carbon nano material 140, the thermal conductivity of the carbon nano material 140 is higher than 10 W/m-K. In some embodiments, depending on chip size, chip spacing and the technology employed, the thickness of the carbon nano material 140 ranges from about 0.5 microns to about 300 microns.

A molding compound 150 is then formed over first substrate 110 and encapsulates the carbon nano material 140, first chips 100a, and/or catalyst layer 125. The molding compound 150 is configured to provide package stiffness, a protective or hermetic cover, shielding, and/or provide a heat conductive path to prevent chip overheating. Molding compound 150 comprises any material such as epoxy, epoxy with thermally conductive filler materials, organic cylinders, plastic molding compound, plastic molding compound with fiber, or other suitable material. In some embodiments, the molding compound 150 is formed by a spin-on coating process, an injection molding process, and/or other suitable process.

Figure 6:
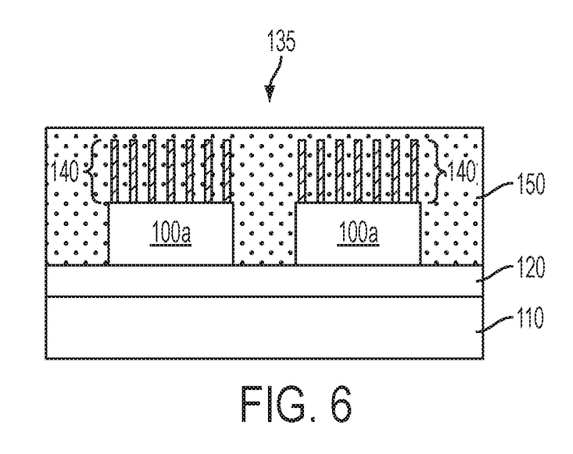

FIG. 6 is a cross sectional view of the semiconductor package 135, after the molding compound 150 is formed on first substrate 110, and the molding compound 150 is planarized, in accordance with one or more embodiments. In some embodiments, the molding compound 150 is planarized by a chemical mechanical polishing (CMP) process, for example. Mechanical grinding processes such as CMP sometimes cause damage to the semiconductor package 135. Accordingly, in some embodiments, a method less likely to cause damage such as, for example, wet chemical etching, dry chemical etching, dry polishing, plasma etching, or other suitable etching process is used to planarize the molding compound 150.

Figure 7:
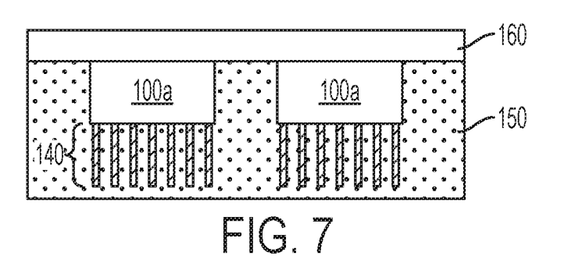

FIG. 7 is a cross-sectional view of the semiconductor package 135 in an inverted position, having been flipped following a planarization process, in accordance with one or more embodiments. The semiconductor package 135 is released from the first substrate 110 and the chip side of the semiconductor package 135 is bonded to a package substrate 160. In other embodiments, the first substrate 110 remains attached to the semiconductor package 135 to become the package substrate 160. In some embodiments, package substrate 160 has formed therein any of several additional microelectronic layers such as RDLs (redistribution layers) (not shown) and microelectronic materials such as conductor materials, semiconductor materials, and dielectric materials.

In some embodiments, package substrate 160 also includes active and passive devices (not shown).

Figure 8:
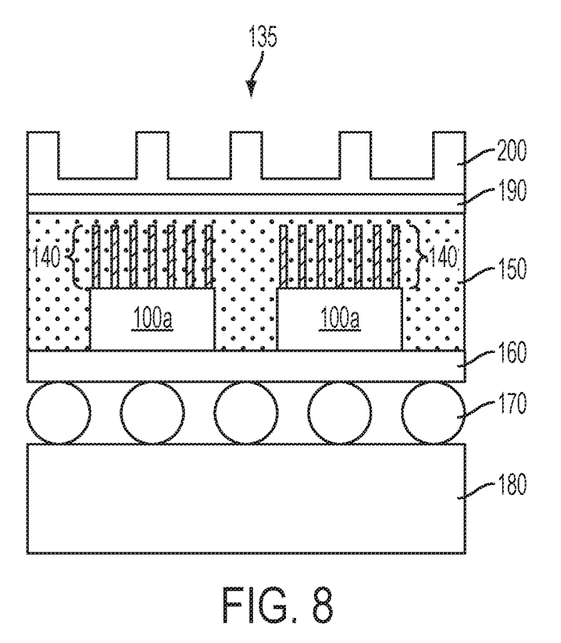

FIG. 8 is a cross-sectional view of the semiconductor package 135 mounted onto a board 180, such as a printed circuit board (PCB) by electrical connectors 170, such as ball grid array (BGA). In some embodiments, the electrical connectors 170 comprise lead free solder or other suitable electrical connection material. A thermal interface material (TIM) 190 is dispensed on top of the molding compound 150, the carbon nano material 140 and chips 100a. In some embodiment, TIM 190 comprises a thermally conductive and electrically insulative material, such as an epoxy, like an epoxy mixed with a metal like silver or gold, a "thermal grease," a "white grease," other suitable material, or a combination thereof. In some embodiments, a thermal management device 200 such as a heat sink is placed on the TIM 190 to facilitate the dissipation of heat from chips 100a.

Figure 9:
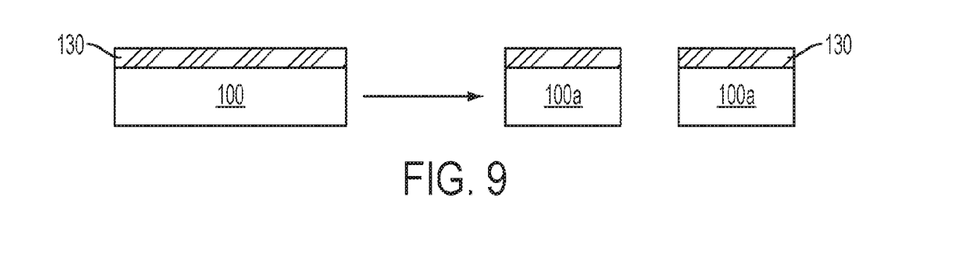
FIGS. 9-11 are cross-sectional views of a semiconductor package at various stages of fabrication, according to one or more embodiments of the present disclosure.
Figure 10:
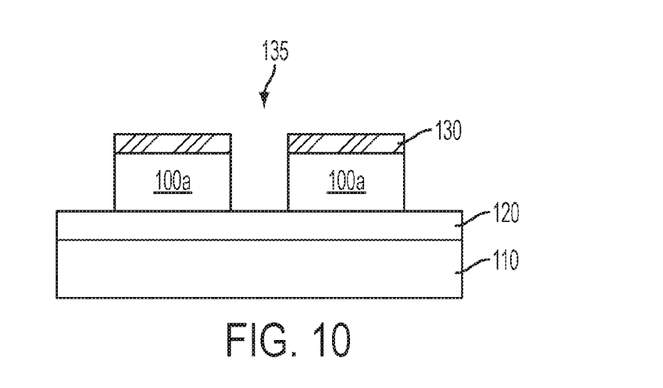
Figure 11:
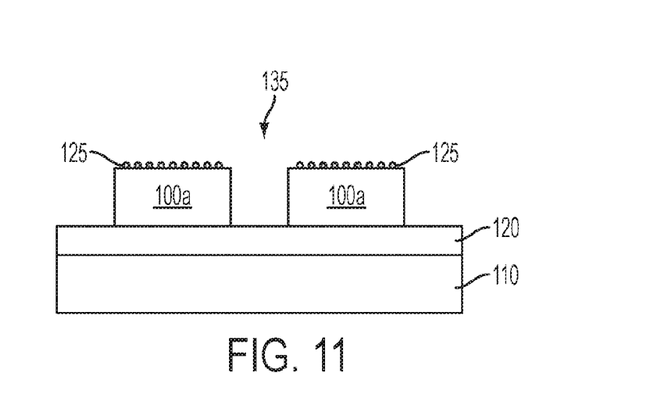

FIGS. 9-11 are cross-sectional views of a semiconductor package at various stages of fabrication, according to one or more embodiments of the present disclosure. FIGS. 9-11 have been simplified for a better illustration of the concepts of the present disclosure. It should be appreciated that the materials, geometries, dimensions, structures, and process parameters described herein are exemplary only, and are not intended to be, and should not be construed to be, limiting to the present disclosure. Many alternatives and modifications will be apparent to those skilled in the art, once informed by the present disclosure.

Referring to FIG. 9, a metal layer 130 is deposited on a surface of a chip 100. Chip 100 is a heat sensitive chip such as a memory chip, logic chip, processor chip, or the like. The metal layer 130 comprises a conductive material such as, for example iron (Fe), cobalt (Co), nickel (Ni), molybdenum (Mo), gold (Au), silver (Ag), palladium (Pd), platinum (Pt), copper (Cu), aluminum (Al), manganese (Mn), tin (Sn), chromium (Cr), magnesium (Mg), or alloys thereof and is deposited to a thin layer by an E-beam evaporation process, a sputter process, or the like. In some embodiments, the metal layer 130 has a thickness from about 10 Angstroms to about 1,000 Angstroms.

Chip 100 is subjected to a singulation process whereby it is affixed to a dicing tape or a die frame (not shown) and chip 100 is die cut or diced along cutting lines to separate chip 100 into individual units 100a.

FIG. 10 is a cross-sectional view of a portion of a semiconductor package 135 at a stage of fabrication, according to one or more embodiments of the present disclosure. The semiconductor package 135 includes a first substrate 110. In some embodiments, the first substrate 110 is a wafer carrier. First substrate 110 acts as a temporary support substrate or carrier to facilitate wafer handling, transport, and/or processing. First substrate 110 comprises a combination of a silicon substrate, a glass substrate, a polymer substrate, a polymer-based composite substrate, a thick tape, or other suitable material. First substrate 110, in some embodiments, is a rigid carrier configured to reduce wafer warping and/or to prevent wafer breakage that often occurs during handling and processing. First substrate 110 has chips 100a and metal layers 130 attached to a surface thereto by an adhesive layer 120. In some embodiments, the adhesive layer 120 comprises one or more of an adhesive bonding, tape bonding, or other suitable material.

In FIG. 11, semiconductor package 135 is subjected to a thermal anneal process to convert the metal layers 130 into catalyst layers 125 that comprise of metal nano particles. The catalyst layer 125 is used to form a layer of carbon nano material such as, for example carbon nano fibers (CNFs) and carbon nanotubes (CNTs) that are grown on chips 100a and the catalyst layer 125 is arranged where this growth is desirable. According to one or more embodiments, the layer of carbon nano material is grown from the catalyst layers 125 when the semiconductor package 135 is heated to a temperature between about 300 degrees Celsius and about 1,000 degrees Celsius for a time period of about 10 minutes to about 600 minutes.

Additional processes such as the formation of the layer of carbon nano material (e.g., CNFs and CNTs) on the exposed catalyst layer 125 and their implementation in the semiconductor package 135 are the same as the process steps described in FIGS. 5-8 and therefore will not be repeated again.

In one or more embodiments, the layer of carbon nano material, such as carbon nanotubes or carbon nano fibers in a semiconductor package provides a high degree of heat dissipation by providing a thermal path through which thermal energy, or heat that is generated by a chip is dissipated to the ambient or environment.

In one or more embodiments, use of carbon nano material, such as carbon nanotubes or carbon nano fibers in a semiconductor package allows heat generated by temperature sensitive chips to be effectively and/or efficiently dissipated to the ambient or to a thermal management device to prevent overheating of the chip.

In one or more embodiments, use of carbon nano material, such as carbon nanotubes or carbon nano fibers in a semiconductor package provides mechanical support during molding to minimize molding compound shrinkage and/or warpage.

Various aspects of the present disclosure have been described. According to one aspect of this description, a method of forming a semiconductor package includes growing a layer of carbon nano material on a chip. The chip has a first surface and a second surface and the layer of carbon nano material is grown on the first surface of the chip. The layer of carbon nano material is configured to provide a path through which heat generated from the chip is dissipated. A substrate is attached to the second surface of the chip. A molding compound is formed above the substrate to encapsulate the chip and the layer of carbon nano material.

According to another aspect of this description, a method for forming a semiconductor device includes growing a seed layer on a first surface of a chip. A layer of carbon nano material is grown on the seed layer. The layer of carbon nano material is configured to provide a path through which heat generated from the chip is dissipated. A substrate is attached to a second surface of the chip. A molding compound is formed above the substrate to encapsulate the chip, the seed layer, and the layer of carbon nano material.

According to yet another aspect of this description, a semiconductor package includes a chip attached to a first substrate. A layer of carbon nano material is attached to a surface of the chip, wherein the layer of carbon nano material is configured to provide a path through which heat generated from the chip is dissipated. A molding compound is formed above the first substrate, the molding compound encapsulating the chip and the layer of carbon nano material.

In the preceding detailed description, various embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims and their range of equivalents.

What is claimed is:

1. A semiconductor package, comprising:
   a chip attached to a first substrate;
   a layer of carbon nano tubes or fibers, wherein carbon nano tubes or fibers of the layer of carbon nano tubes or fibers are spaced apart generally in parallel with one another on a surface of the chip so the carbon nano tubes or fibers are generally oriented in parallel with each other and are arranged perpendicular to the surface of the chip, wherein the layer of carbon nano tubes or fibers is configured to provide a path through which heat generated from the chip is dissipated; and
   a molding compound formed above the first substrate, the molding compound encapsulating the chip and extending over upper ends of the carbon nano tubes or fibers in the layer of carbon nano tubes or fibers.

2. The semiconductor package of claim 1, wherein the layer of carbon nano tubes or fibers includes a catalyst layer for growing the layer of carbon nano tubes or fibers.

3. The semiconductor package of claim 1, further comprising:
   a second substrate attached to the first substrate by one or more of a ball grid array, a land grid array, or a pin grid array.

4. The semiconductor package of claim 1, wherein the layer of carbon nano tubes or fibers has a thickness ranging from about 0.5 microns to about 300 microns.

5. The semiconductor package of claim 1, further comprising:
   a layer of thermally conductive and electrically insulative material in direct contact with a planar upper surface of the molding compound; and
   a heat sink above the layer of thermally conductive and electrically insulative material.

6. A semiconductor package, comprising:
   a substrate having an upper surface and a lower surface;
   a first chip attached to a first portion of the upper surface of the substrate;
   a second chip attached to a second portion of the upper surface of the substrate, the first portion and the second portion being mutually exclusive so the first chip is spaced laterally apart from the second chip on the upper surface of the substrate;
   a first plurality of carbon nano material pillars attached to an uppermost surface of the first chip, wherein the first plurality of carbon nano material pillars are configured to provide a first path through which heat generated from the first chip is dissipated;
   a second plurality of carbon nano material pillars attached to an uppermost surface of the second chip, wherein the second plurality of carbon nano material pillars are configured to provide a second path through which heat generated from the second chip is dissipated; and
   a molding compound disposed above the substrate, the molding compound encapsulating the first chip, the first plurality of carbon nano material pillars, the second chip, and the second plurality of carbon nano material pillars.

7. The semiconductor package of claim 6, further comprising:
   an adhesive tape disposed directly on the upper surface of the substrate and affixing the first chip and the second chip to the upper surface of the substrate.

8. The semiconductor package of claim 6, wherein the first plurality of carbon nano material pillars have a thermal conductivity between about 3 Watts/meter*Kelvin (W/m*K) and about 10 W/m*K.

9. The semiconductor package of claim 6, wherein the first plurality of carbon nano material pillars have a thickness ranging from about 0.5 microns to about 300 microns.

10. The semiconductor package of claim 6, wherein the molding compound has an uppermost surface that is planar.

11. The semiconductor package of claim 10, further comprising:
    a layer of thermally conductive and electrically insulative material in direct contact with the planar uppermost surface of the molding compound; and
    a heat sink above the layer of thermally conductive and electrically insulative material.

12. The semiconductor package of claim 11, wherein the heat sink comprises:
    a base portion covering the layer of thermally conductive and electrically insulative material; and
    plurality of vertical protrusions that extend upward in a first direction from the base portion; and
    wherein the first plurality of carbon nano material pillars and the second plurality of carbon nano material pillars are each elongated in the first direction within the molding compound.

13. The semiconductor package of claim 6, wherein the first plurality of carbon nano material pillars and the second plurality of carbon nano material pillars each comprises carbon nanotubes (CNTs) and carbon nano fibers (CNFs).

14. The semiconductor package of claim 6, wherein the first plurality of carbon nano material pillars and the second plurality of carbon nano material pillars each includes a catalyst layer on which the first plurality of carbon nano material pillars and the second plurality of carbon nano material pillars reside.

15. The semiconductor package of claim 6, further comprising:
    a second substrate attached to the lower surface of the substrate by one or more of a ball grid array, a land grid array, or a pin grid array.

16. A semiconductor package, comprising:
    a substrate having an upper surface;
    a chip attached to the upper surface of the substrate, the chip having an uppermost planar chip surface and outer chip sidewalls;
    a plurality of carbon nano material pillars attached to the uppermost planar chip surface, wherein the plurality of carbon nano material pillars includes at least three adjacent carbon nano material pillars that are configured to provide a path through which heat generated from the chip is dissipated; and
    a molding compound disposed over the substrate, disposed along the uppermost planar chip surface and along the outer chip sidewalls, and directly contacting inner and outer sidewalls of each of the at least three adjacent carbon nano material pillars to separate nearest neighbor carbon nano material pillars of the at least three adjacent carbon nano material pillars from one another.

17. The semiconductor package of claim 16, further comprising:
    a thermal interface material (TIM) above the molding compound, the TIM having a lower surface that is spaced apart from uppermost surfaces of the plurality of carbon nano material pillars by the molding compound; and
    a heat sink above the TIM.

18. The semiconductor package of claim 16, wherein the plurality of carbon nano material pillars comprises carbon nanotubes (CNTs) and carbon nano fibers (CNFs).

19. The semiconductor package of claim 16, further comprising:
- a layer of thermally conductive and electrically insulative material in direct contact with a planar upper surface of the molding compound; and
- a heat sink above the layer of thermally conductive and electrically insulative material.

20. The semiconductor package of claim 19, wherein the heat sink comprises:
- a base portion covering the layer of thermally conductive and electrically insulative material; and
- plurality of vertical protrusions that extend upward in a first direction from the base portion; and
- wherein the plurality of carbon nano material pillars are each elongated in the first direction within the molding compound.

\* \* \* \* \*